(12) United States Patent
Kuwata

(10) Patent No.: US 7,251,262 B2
(45) Date of Patent: Jul. 31, 2007

(54) SURFACE EMITTING SEMICONDUCTOR LASER AND COMMUNICATION SYSTEM USING THE SAME

(75) Inventor: Yasuaki Kuwata, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 339 days.

(21) Appl. No.: 10/691,503

(22) Filed: Oct. 24, 2003

(65) Prior Publication Data
US 2004/0184500 A1 Sep. 23, 2004

(30) Foreign Application Priority Data
Mar. 19, 2003 (JP) ............................. 2003-075443

(51) Int. Cl.
H01S 5/00 (2006.01)
H01S 3/13 (2006.01)
H01S 3/097 (2006.01)

(52) U.S. Cl. ....................... 372/50.124; 372/19; 372/87

(58) Field of Classification Search ........... 372/50.124, 372/87
See application file for complete search history.

(56) References Cited

U.S. PATENT DOCUMENTS

| | | | | |
|---|---|---|---|---|
| 5,426,657 A | * | 6/1995 | Vakhshoori | ............... 372/45.01 |
| 5,838,715 A | * | 11/1998 | Corzine et al. | ................ 372/96 |
| 5,879,961 A | * | 3/1999 | Scott | ............................ 438/32 |
| 5,892,784 A | * | 4/1999 | Tan et al. | ................. 372/50.21 |
| 6,185,241 B1 | * | 2/2001 | Sun | .............................. 372/96 |
| 6,277,696 B1 | * | 8/2001 | Carey et al. | ................ 438/289 |
| 6,480,516 B1 | * | 11/2002 | Shimizu | .................. 372/43.01 |
| 6,507,595 B1 | * | 1/2003 | Kapon et al. | .......... 372/45.013 |
| 6,876,805 B2 | * | 4/2005 | Wang | .......................... 385/125 |
| 6,885,690 B2 | * | 4/2005 | Aggerstam et al. | ........... 372/96 |
| 6,905,900 B1 | * | 6/2005 | Johnson et al. | ................ 438/29 |
| 6,906,353 B1 | * | 6/2005 | Shieh et al. | ................... 257/98 |
| 7,061,945 B2 | * | 6/2006 | Cox et al. | ....................... 372/19 |
| 2002/0141472 A1 | * | 10/2002 | Koyama et al. | ............... 372/96 |
| 2002/0181536 A1 | * | 12/2002 | Jeon | ............................ 372/96 |
| 2003/0139060 A1 | * | 7/2003 | Sai | .............................. 438/767 |
| 2004/0066820 A1 | * | 4/2004 | Johnson et al. | ................ 372/45 |
| 2004/0213311 A1 | * | 10/2004 | Johnson et al. | ................ 372/45 |

FOREIGN PATENT DOCUMENTS

JP A 9-326530 12/1997
JP A 2001-156395 6/2001

* cited by examiner

Primary Examiner—Minsun Oh Harvey
Assistant Examiner—Phillip Nguyen
(74) Attorney, Agent, or Firm—Oliff & Berridge, PLC

(57) ABSTRACT

A surface emitting semiconductor laser includes a laminate of semiconductor layers emitting multimode laser light, and a block member blocking light of a specific mode among the multimode laser light emitted from the laminate.

7 Claims, 9 Drawing Sheets

110 LASER DEVICE

SURFACE EMITTING SEMICONDUCTOR LASER AND COMMUNICATION SYSTEM USING THE SAME

BACKGROUND OF THE INVENTION

1. Field of the Invention

The present invention relates to a surface emitting semiconductor laser of selective oxidization type, and more particularly, to a structure for controlling the optical power of a multimode surface emitting semiconductor laser.

2. Description of the Related Art

Recently, there has been an increased demand for a surface emitting semiconductor laser that can easily realize an arrangement of a two-dimensional array of sources in the technical fields of optical communications and optical recording. Such a surface emitting semiconductor laser is also called a vertical-cavity surface-emitting laser (VCSEL). The VCSEL has many advantages of a low threshold voltage, low power consumption, easy making of a circular spot of light and good productivity resulting from wafer-based evaluation.

Nowadays, low-cost multimode optical fibers, which are typically plastic optical fibers (POF), are developed, and short-distance optical communications as short as a few meters to several hundreds of meters are getting the attention. Generally, long-distance optical communications employ the combination of a single-mode type optical fiber and an edge emitting semiconductor laser having a relatively long wavelength of 1.31 μm or 1.55 μm. However, these components are expensive and are unsuitable for applications in local areas that should be less expensive.

An optical source used for the multimode optical fiber is required to be less expensive and avoid the use of a special optical system or driving system. The surface emitting semiconductor laser may satisfy the above-mentioned requirements and is one of the powerful options as the optical source for the multimode optical fiber. In order to use the surface emitting semiconductor laser as the optical source in optical communications utilizing the multimode optical fiber, it is desired to stabilize the oscillation mode and reduce jitter components contained in the optical output.

Japanese Laid-Open Patent Application Publication No. 2001-156395 discloses a selectively oxidization type surface emitting semiconductor laser in which an optically transparent layer is formed in a beam emitting aperture for controlling the oscillation transverse mode. The transparent layer may, for example, be a dielectric film, and functions to reduce the reflectance of an area that does not desire laser oscillation, so that the oscillation transverse mode can be controlled.

Japanese Laid-Open Patent Application Publication No. 9-326530 proposes a VCSEL intended to reduce the jitter (fluctuation in the turn-on delay time) of the laser device. A diffusion reinforcement region provided in the vicinity of the active layer is doped with an acceptor impurity of a high concentration, so that the number of holes induced in the quantum well region is approximately one-digit larger than the number of electrons therein. This increases the diffusion rate in the quantum well region.

However, the conventional selectively oxidization type semiconductor lasers have the following problems to be solved. FIGS. 7A and 7B respectively show a beam profile and an optical output profile in a far-field image obtained when the multimode surface emitting semiconductor laser is used as an optical source. A symbol L denotes the distance from the optical source to the far-field image, and θ denotes the divergence angle of the diameter of the beam in the far-field image viewed from the center of the optical source. Generally, this kind of surface emitting semiconductor laser has a profile like a doughnut shape. More particularly, the laser beam of the fundamental mode exists within a spread or divergence angle $\theta_0$ from the center of the optical source, and the beam profile is indicated by P0. When the divergence angle is greater than $\theta_0$, the resultant laser beam is of a high-order mode in which the first-order mode or a higher-order mode in addition to the first-order mode is combined with the fundamental mode. The beam profile of the high-order-mode laser beam is indicated by P1. The optical output in the high-order mode indicated by P1 is grater than that of the fundamental mode. In other words, the outer portion P1 of the doughnut-like profile involved in the first-order or higher-mode is brighter than the inner portion P0 involved in the fundamental mode. The laser emissions in the oscillation modes do not have the same profiles and do not occur concurrently. Thus, there is a difference in response between the fundamental-mode light and the first-order or higher-order light. The difference in response causes the jitter in the optical signal when the multimode surface-emitting laser is used as the optical source.

FIG. 8A shows an eye pattern that serves as an index for checking the quality of the laser beam. The eye pattern is a pattern in which, when the laser beam is modulated (turned on and off), the modulated light signal is superimposed at random. The horizontal axis of the eye pattern denotes the time, and the vertical axis denotes the optical power. The eye pattern shown in FIG. 8A is an example observed when a multimode VCSEL capable of outputting light that has an optical power of 3 mW and a wavelength of 850 nm is used as the optical source. It can be seen from the eye pattern of FIG. 8A that each emission in the respective oscillation mode does not occur concurrently, so that a jitter J takes place. The jitter J is the time difference in response between the optical signals in the oscillation modes. The eye pattern ideally converges on a single line. If the optical output contains a jitter that exceeds a threshold time, the rate of incidence of error contained in the optical signal on the receive device side will considerably increase. This restrains the maximum bit rate achievable in the data link.

The aforementioned transparent layer arranged in the vicinity of the beam emission aperture proposed in Japanese Laid-Open Patent Application Publication No. 2001-156395 is not intended to reduce the jitter in the multimode laser beam but to control the oscillation transverse mode. The VCSEL proposed in Japanese Laid-Open Patent Application Publication No. 9-326530 does not have any mechanism for reducing the jitter.

SUMMARY OF THE INVENTION

The present invention has been made in view of the above circumstances and provides a surface emitting semiconductor laser.

According to an aspect of the present invention, there is provided a surface emitting semiconductor laser comprising: a laminate of semiconductor layers emitting multimode laser light; and a block member blocking light of a specific mode among the multimode laser light emitted from the laminate.

According to another aspect of the present invention, there is provided a surface emitting semiconductor laser comprising: a surface emitting semiconductor laser capable of emitting multimode laser beam; a package that houses the surface emitting semiconductor laser and has a transmission window via which the multimode laser light is emitted; and a block member that is provided in the transmission window and blocks light of a specific mode among the multimode laser light.

BRIEF DESCRIPTION OF THE DRAWINGS

Preferred embodiments of the present invention will be described in detail based on the following figures, wherein.

DESCRIPTION OF THE PREFERRED EMBODIMENTS

A description will now be given of embodiments of the present invention with reference to the accompanying drawings.

Figure 1A:
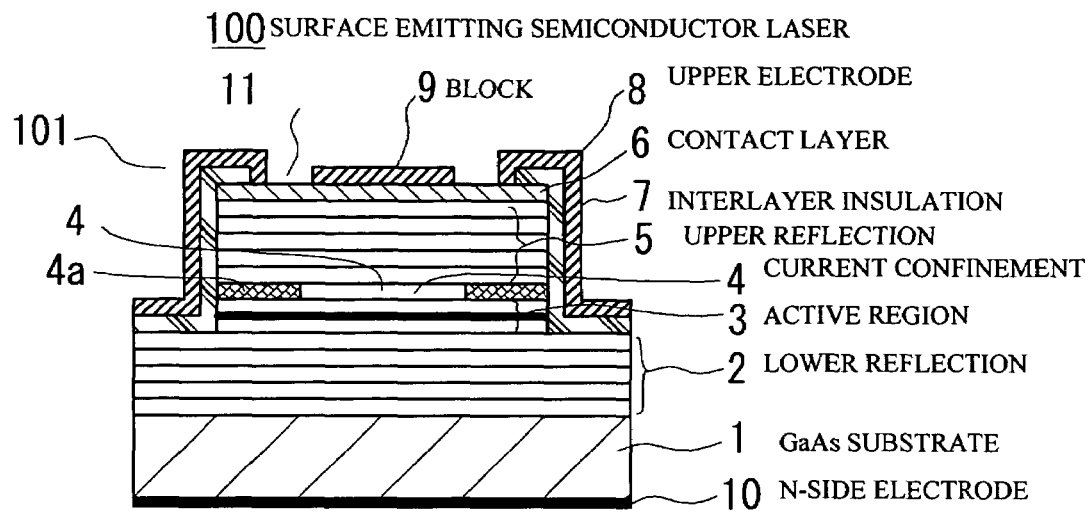
FIG. 1A is a cross-sectional view of a surface emitting semiconductor laser according to a first embodiment of the present invention taken along a line X1-X1 shown in FIG. 1B.
Figure 1B:
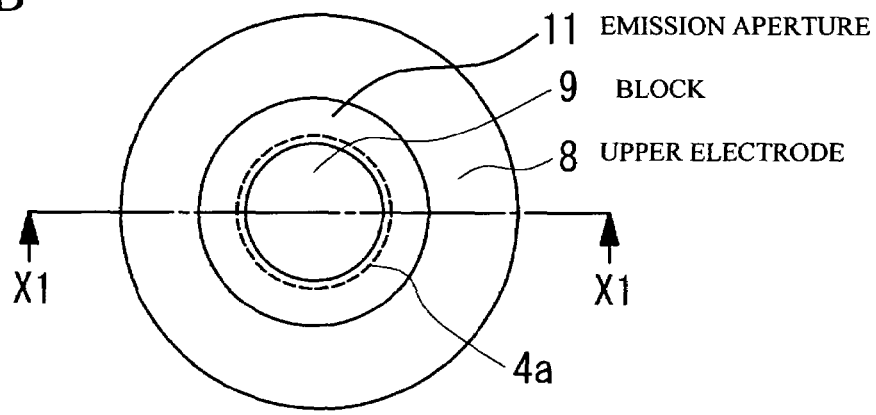
FIG. 1B is a plan view of the surface emitting semiconductor laser according to the first embodiment of the present invention.
Figure 1C:
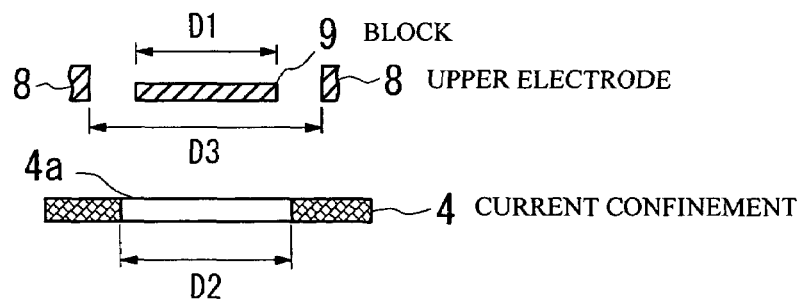
FIG. 1C shows a relation between a block member and an emission aperture in the first embodiment of the present invention.

FIG. 1A is a cross-sectional view of a VCSEL according to a first embodiment of the present invention taken along a line X1-X1 shown in FIG. 1B that is a plan view of the VCSEL, and FIG. 1C shows a relation between the size of a block member and an emission aperture.

A multimode surface emitting semiconductor device 100 has an n-type GaAs substrate 1 on which laminated are an n-type lower multilayer reflection film 2, an undoped active region 3, a current confinement layer 4, a p-type upper multilayer reflection film 5, a p-type contact layer 6, an interlayer insulation film 7, a p-type upper electrode 8, and a block member 9 provided in the emission aperture 11. An n-type backside electrode 10 is provided on the backside of the n-type GaAs substrate 1.

A cylindrical mesa or post 101 is formed on the substrate 1 so that the post 101 ranges from the contact layer 6 to the active region 3. The bottom of the post 101 is an exposed portion of the lower multilayer reflection film 2. The interlayer insulation film 7 totally covers the bottom and side of the post 101, and partially covers the top of the post 101. On the top of the post 101, the upper electrode 8 for making an electrical contact with the contact layer 6 is disposed. Further, the upper electrode 8 defines the emission aperture 11, which is a circularly-shaped aperture. The upper electrode 8 extends from the top of the post 101 to the bottom thereof via the side, and is connected to an electrode pad (not shown).

The circular block member 9 is placed on the emission aperture 11. The block member 9 and the emission aperture 11 are concentrically arranged, and the centers thereof coincide with the optical axis of the post 101. The block member 9 should have an ability of blocking light from the post 101, and may be made of a metal or another kind of material. Preferably, the block member 9 is made of the same material as the upper electrode 8. In this case, the block member 9 and the upper electrode 8 can be defined simultaneously. As will be described later, the block member 9 blocks light of a specific mode among the multimode laser beams emitted from the post 101. The current confinement layer 4 includes a conductive region formed by the AlAs layer and an oxide region 4a that surrounds the periphery of the conductive region. The oxide region 4a is formed by selectively oxidizing the AlAs layer from the side surface of the post 101. By controlling the oxidization distance from the side surface of the post 101, it is possible to obtain a desired aperture size suitable for the outer diameter of the post 101. In the present embodiment, in order to oscillate the multimode laser beams, the current confinement layer 4 is designed so that the conductive region has a diameter D2 of 8 microns, and the emission aperture 11 has a diameter D3 of 10 microns. The block member 9 is designed to have a diameter D1 of 3 microns. The diameter D1 of the block member is selected so as to suitably block the laser beam of the fundamental mode among the multimode laser light, as will be described later. For example, the diameter (size) of the block member 9 is smaller than that of the conductive region in the current confinement layer 4.

Figure 7A:
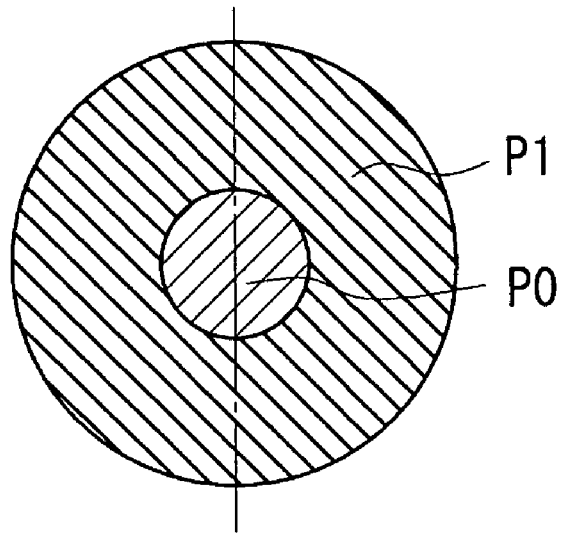
FIG. 7A is a beam profile of a conventional surface emitting semiconductor laser in a far-field image.
Figure 7B:
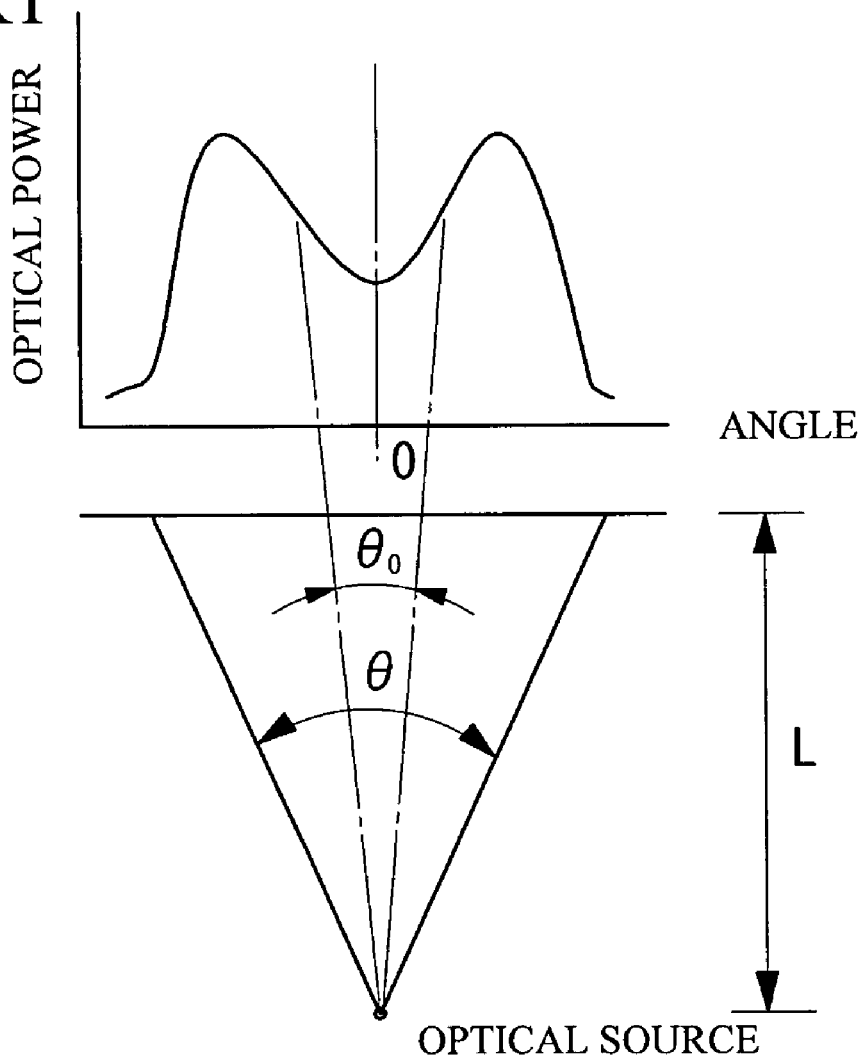
FIG. 7B is a relation between the divergence angle from an optical source and the optical output in the conventional surface emitting semiconductor laser.

As has been described previously with reference to FIGS. 7A and 7B, the selectively oxidization type multimode surface emitting semiconductor laser generates the fundamental mode within the angle $\theta_0$ about the optical axis of the optical source, and generates a higher-order mode at an angle larger than the angle $\theta_0$. The optical power of the higher-order mode is greater than that of the fundamental mode. The frequency response of the fundamental mode in the inner area P0 of the doughnut-like profile is greater than that in the outer area P1. In the present embodiment, since the block member 9 is provided in the emission aperture 11, the light of the fundamental mode is blocked. The optical power of the fundamental mode is smaller than that of the light of the higher-order mode. Thus, even if the fundamental mode is cutoff, the total optical power will not be greatly reduced. By shutting out the light of the fundamental mode, the time difference in response between the modes can be reduced, so that the jitter contained in the laser beam can be reduced and the frequency response can be improved.

Figure 2A:
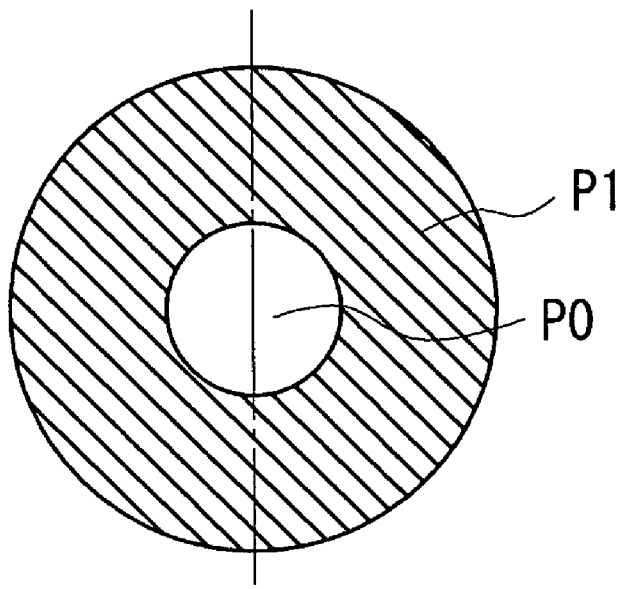
FIG. 2A is a beam profile of the laser shown in FIGS. 1A through 1C in a far-field image.
Figure 2B:
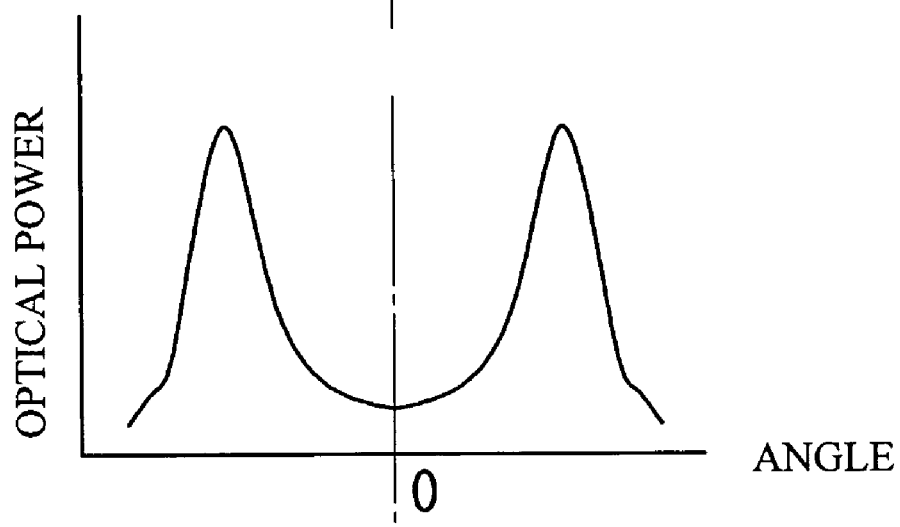
FIG. 2B is a relation between the divergence angle from an optical source and the optical output in the first embodiment of the present invention.
Figure 2B:
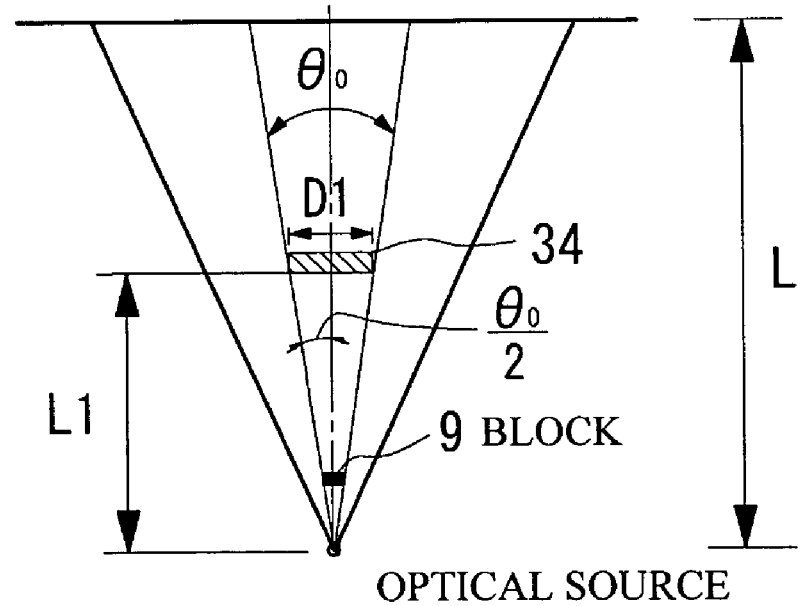

FIG. 2A shows a laser profile of the laser beam in a far-field image with the block member 9, and FIG. 2B shows an output profile thereof. The light of the fundamental mode among the multimode laser beams has an angle $\theta_0$ in the far-field image at a distance L from the optical source. The block member 9 is designed to have a diameter D1 enough large to cover the angle $\theta_0$, and may be 3 microns in the present embodiment. Thus, the light of the fundamental mode among the beams emitted from the post 101 is shut out by the block member 9, and the remaining beams are emitted via the emission aperture 11. The inner region P0 of the doughnut-like profile is totally covered by the block member 9, while only light of the first-order or higher-order mode located on the outer area P1 can be emitted.

Figure 8A:
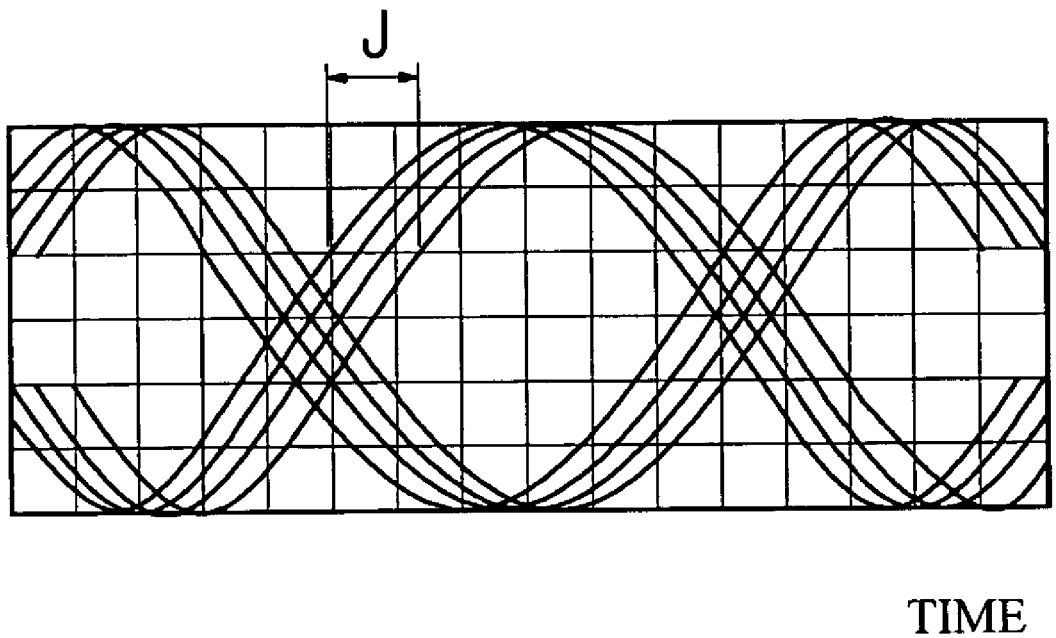
FIGS. 8A and 8B show eye patterns of laser beams.
Figure 8B:
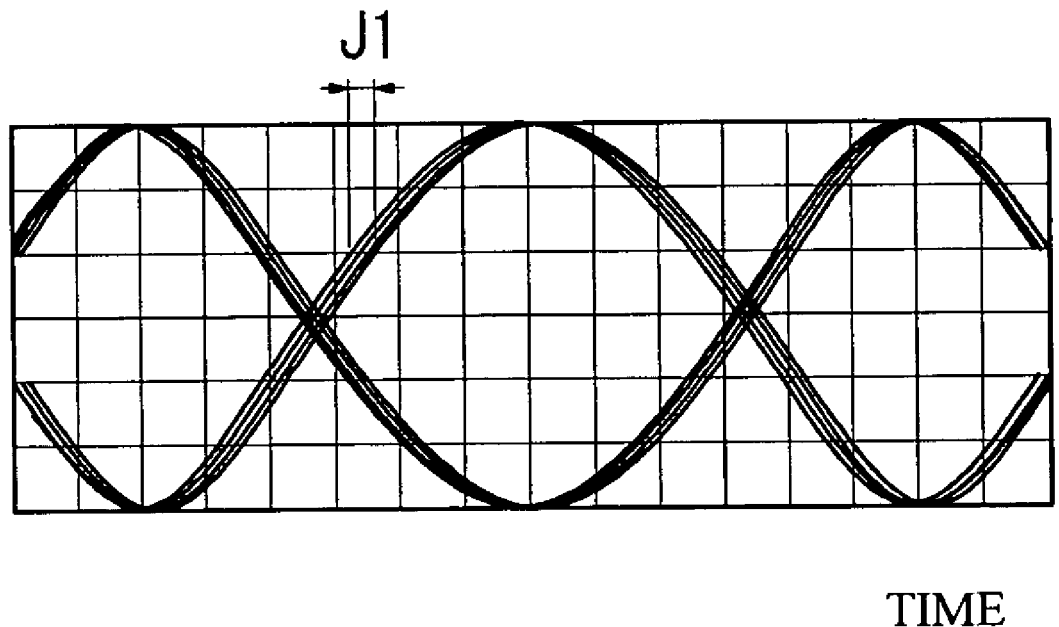

The use of the block member 9 brings about an improved eye pattern as shown in FIG. 8B. As compared to the conventional laser in the absence of any block member, according to the present embodiment, the eye pattern is converged and the jitter J1 is reduced.

Figure 3A:
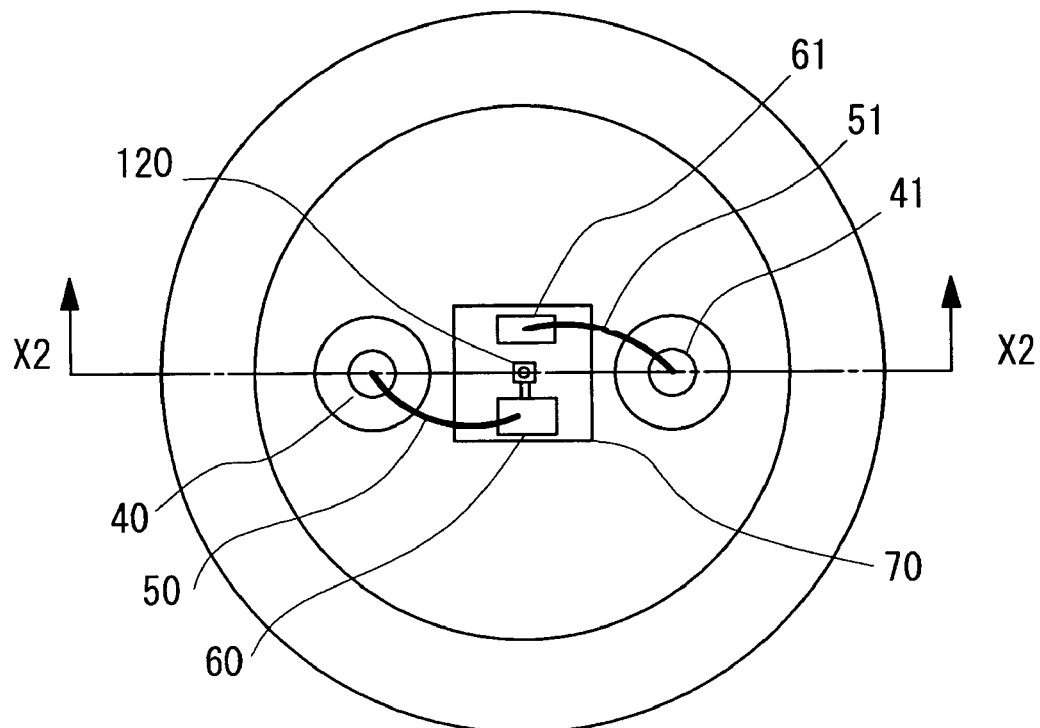
FIG. 3A is a plan view of a surface emitting semiconductor laser device according to a second embodiment of the present invention.
Figure 3B:
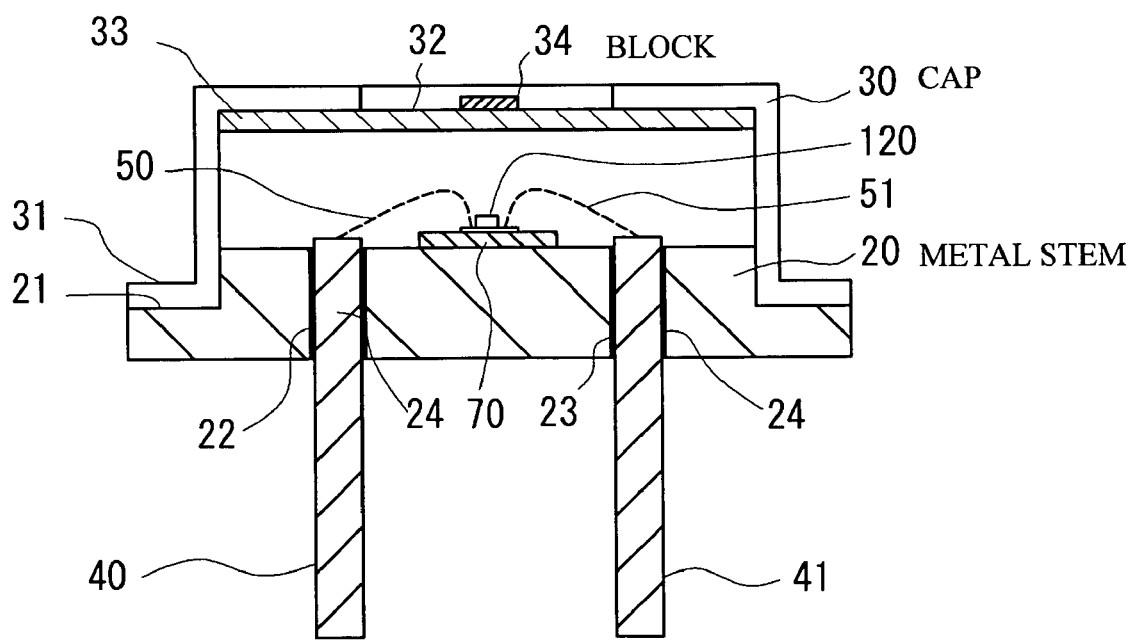
FIG. 3B is a cross-sectional view taken along a line X2-X2 shown in FIG. 3A.

A description will now be given of a surface emitting semiconductor laser according to a second embodiment of the present invention with reference to FIGS. 3A and 3B. FIG. 3A is a plan view of the surface emitting semiconductor laser mounted on a metal stem (a cap has been removed from the stem), and FIG. 3B is a cross-sectional view taken along line X2-X2 shown in FIG. 3A.

A laser device 110 according to the second embodiment of the present invention does not employ the block member 9 in the emission aperture 11 of a surface emitting semiconductor laser 110, but includes a block member in a transmission window of a casing body on which the semiconductor laser is mounted.

The surface emitting semiconductor laser device 110 includes a metal stem 20, and a metal cap 30 attached to the metal stem 20. The metal stem 20 is a thin plate of a circular shape, and has a ring-shaped flange 21 including a step on the circumferential periphery of the metal step 20. The cap 30 has a single open side, and includes an inside hollow cylindrical space. The cap 30 has an end portion 31, which is formed on its circumferential periphery and horizontally protrudes from the side surface thereof. A circular transmission window (aperture) 32 is formed in the center of the cap 30. A circular glass member 33 is attached to the back surface of the cap 30 so as to match the shape of the back surface. Preferably, the peripheral surface of the glass member 33 is fused and fixed to the back surface of the cap 30. The glass member 33 closes the transmission window 32 formed in the cap 30. The transmission window 32 serves as a path window via which the laser beam emitted from the post of the surface emitting semiconductor laser 120. The end portion 31 of the cap 30 is fixed to the flange 21 by welding or the like. The cap 30 and the metal step 20 define an inside closed cavity, which is filled with nitrogen. A circular block member 34, which is concentrically arranged with the transmission window 32, is fixed to the glass member 33. The glass member 33 has a size enough large to block the light of the fundamental mode among the multimode laser light emitted from the semiconductor laser 120.

The metal stem 20 has through holes 22 and 23 to which a pair of lead pins 40 and 41 is attached. The pair of lead pins 40 and 41 is provided with an insulating film 24 by which the lead pins 40 and 41 are electrically isolated from the metal stem 20. Ends of the lead pins 40 and 41 protrude from the surface of the metal stem 20. The protruding portions of the lead pins 40 and 41 are connected to bonding pads 60 and 61 by bonding wires 50 and 51.

A mounter 70 is attached to the center of the metal stem 20. The surface emitting semiconductor laser 120 is fixed to the mounter 70. The semiconductor laser 120 is the same as the semiconductor laser 100 shown in FIGS. 1A through 1C except that the laser 120 does not have the block member 9. The mounter 70 may be made of, for example, a semiconductor material such as GaAs or ceramics such as AlO (alumina) and AlN (aluminum nitride). The surface of the semiconductor or ceramic material is plated with a metal such as Au. Alternatively, Au may be deposited on the surface. The n-side electrode 10 of the semiconductor laser 120 is connected to the metal surface of the mounter 70. Further, the electrode pad 61 is provided on the metal surface of the mounter 70. Furthermore, the semiconductor laser 120 includes the post 101 on the semiconductor substrate and includes the electrode pad 60 that is located close to the post 101 and is electrically connected to the p-side electrode 8. The lead pin 40 is electrically connected to the p-side electrode 8 via the bonding wire 50 and the electrode pad 60. The lead pin 41 is electrically connected to the n-side electrode 10 via the bonding wire 51 and the electrode pad 61.

The center of the block member 34 is located on the optical axis of the post 101. As is shown in FIGS. 2A and 2B, the diameter D1 of the block member 34 can be defined as follows:

$$D1 = L1 \times 2\tan(\theta_0/2)$$

where L1 is the distance from the post 101 serving as the optical source to the block member 34. In this case, the parameter $\theta_0$ is the divergence angle of the diameter of the beam of the fundamental mode from the optical source (post) in the far-field image of the multimode light emitted from the optical source. With this arrangement, the block member 34 blocks only the light of the fundamental mode among the multimode light emitted from the post 101.

The block member 34 may be made of a material capable of shutting out light, such as a metal or insulator. Preferably, the surface of the block member 34 is coated with an antireflection film in order to prevent light reflected by the block member 34 from traveling within the cap 30. An adhesive layer may be provided in order to facilitate adhesion of the block member 34 to the glass member 33. The block member 34 may be an absorption member capable of light having a specific wavelength. In this case, the wavelength to be absorbed is the wavelength of emission by the semiconductor laser 120.

According to the second embodiment, after the surface emitting semiconductor laser is mounted, the block member 34 is merely fixed to the glass member 33 of the cap 30, so that the jitter-reduced multimode surface emitting semiconductor laser having improved frequency response can be fabricated without any complex process. The combination of the semiconductor laser thus obtained and the multimode optical fiber will achieve economical optical communication systems having a higher data transmission rate.

Figure 4A:
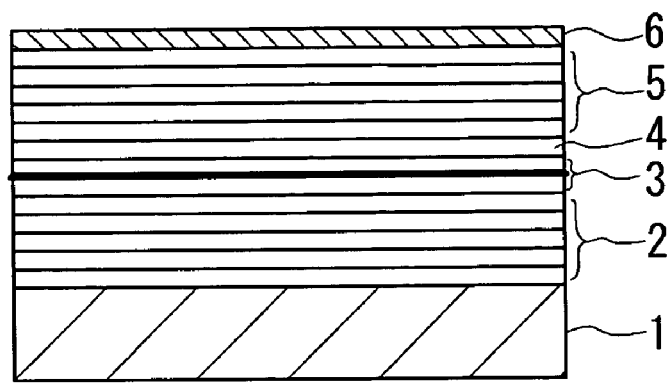
FIGS. 4A, 4B and 4C show a part of a method of fabricating the surface emitting semiconductor laser according to the first embodiment of the present invention.

A description will now be given, with reference to FIGS. 4A to 4C, 5D to 5F and 6G to 6I, of a method of fabricating the surface emitting semiconductor laser according to the first embodiment of the present invention. Referring to FIG. 4A, the lower multilayer reflection film 2, the active region 3, the p-type AlAs layer 4, the upper multilayer reflection film 5, and the AlAs contact layer 6 are laminated on the (100) surface of the semi-insulation GaAs substrate 1 in that order by MOCVD (Metal Organic Chemical Vapor Deposition). The lower multilayer reflection film 2 includes a laminate of pairs of an undoped $Al_{0.8}Ga_{0.2}As$ layer and an undoped $Al_{0.1}Ga_{0.9}As$ layer. The active region 3 is a laminate of a spacer layer formed by an undoped $Al_{0.4}Ga_{0.6}As$, a barrier layer formed by an undoped $Al_{0.2}Ga_{0.8}As$ layer, and a quantum well layer formed by an undoped GaAs layer. The upper multilayer reflection film 5 includes a laminate of pairs of p-type $Al_{0.8}Ga_{0.2}As$ layer and a p-type $Al_{0.1}Ga_{0.9}As$ layer.

The lower multilayer reflection film 2 is composed of multiple pairs of an n-type $Al_{0.9}Ga_{0.1}As$ layer and an n-type $Al_{0.15}Ga_{0.85}As$ layer. Each layer is $\lambda/4n_r$ thick where $\lambda$ is the oscillation wavelength and $n_r$ is the refractive index of the medium. The paired layers having different composition ratios are alternately laminated to a thickness of 36.5 periods. The carrier concentration after the reflection film 2 doped with silicon as the n-type impurity is $3\times10^{18}$ cm$^{-3}$.

The active region 3 includes a laminate of an 8 nm-thick quantum well active layer formed by an undoped GaAs layer and a 5 nm-thick barrier layer formed by an undoped $Al_{0.2}Ga_{0.8}As$ layer, these layers being alternately laminated. The outer layer of the laminate is the barrier layer. The laminate is disposed in the middle of the spacer layer formed by an undoped $Al_{0.4}Ga_{0.6}As$ layer. The thickness of the spacer layer including the quantum well active layer and the barrier layer is designed to be an integer multiple of $\lambda/n_r$. The active region 3 thus formed emits 850 nm light.

The upper multilayer reflection film 5 is a laminate of pairs of a p-type $Al_{0.8}Ga_{0.2}As$ layer and a p-type $Al_{0.1}Ga_{0.9}As$ layer. Each layer is $\lambda/4n_r$ thick. The paired layers having different composition ratios are alternately laminated to a thickness of 22 periods, which include the underlying AlAs layer 4 and the uppermost GaAs layer 6. The AlAs layer 4 is not required to be AlAs throughout the thickness $\lambda/4n_r$, but may include anther semiconductor layer. If the AlAs layer is too thick, optical scattering loss may increase. In the present invention, the AlAs layer 4 is 30 nm thick, and the rest is formed of $Al_{0.9}Ga_{0.1}As$. The carrier concentration after the layer 5 is doped with carbon as the p-type impurity is $4\times10^{18}$ cm$^{-3}$.

In order to reduce the series resistance of the device, an intermediate layer may be placed between the $Al_{0.8}Ga_{0.2}As$ layer and the $Al_{0.1}Ga_{0.9}As$ layer of the upper multilayer reflection film 5, wherein the intermediate layer has an Al composition ratio between these layers.

The uppermost layer of the upper multilayer reflection film 5 is the p-type GaAs layer that is 20 nm thick in order to improve the contact with the p-side electrode 8. The upper multilayer reflection film 5 has a carrier concentration of $1\times10^{19}$ cm$^{-3}$ after it is doped with zinc as the p-type impurity.

Figure 4B:
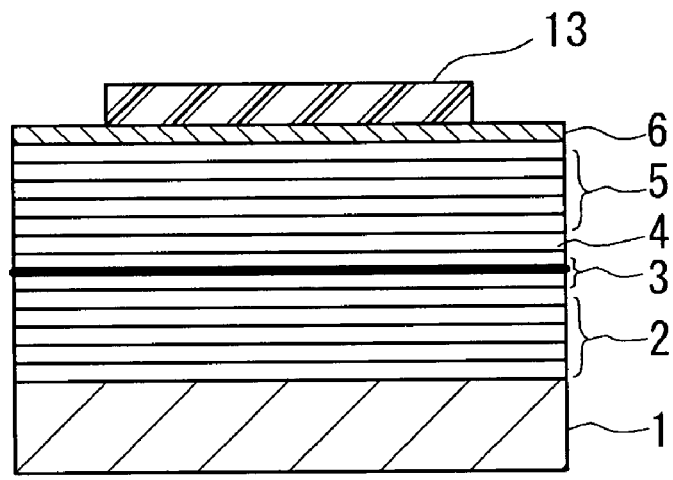
Figure 4C:
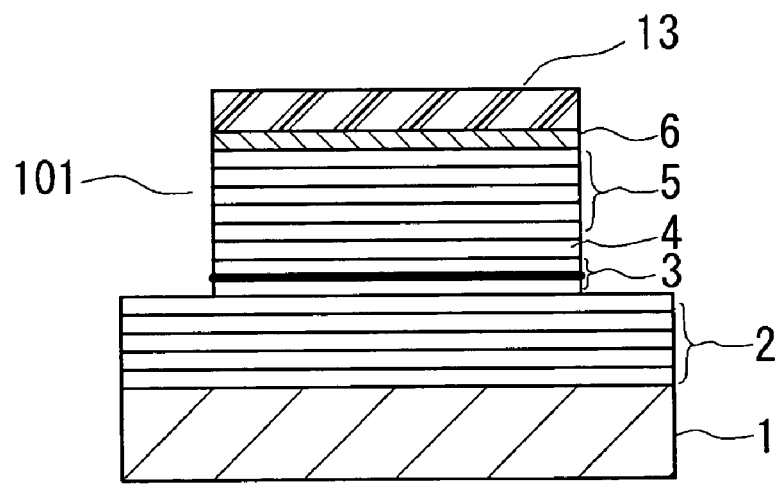

Next, as is shown in FIG. 4B, the substrate (wafer) is removed from the growth chamber, and a mask pattern 13 of $SiO_2$ is photolithographically formed on the substrate. With the $SiO_2$ pattern being used as a mask, the substrate is etched so that the cylindrical mesa or post 101 is formed thereon, as shown in FIG. 4C. Then, the upper multilayer reflection film 5, the AlAs layer 4 and the active region 3 are anisotropically etched by reactive ion etching (RIE).

Figure 5D:
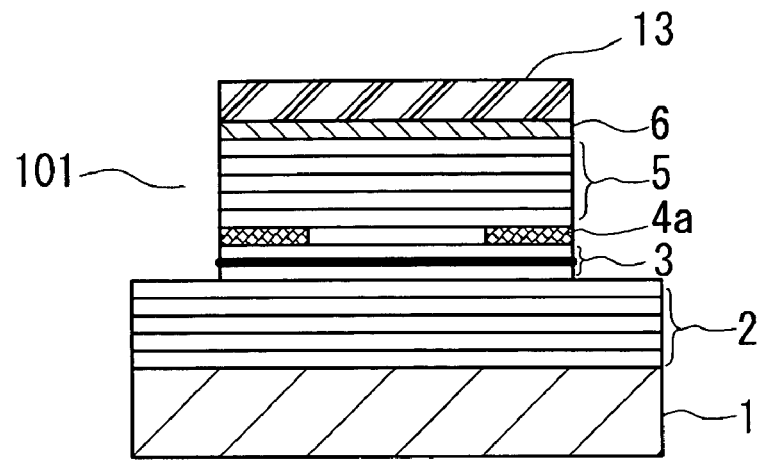
FIGS. 5D, 5E and 5F show another part of the method of fabricating the surface emitting semiconductor laser according to the first embodiment of the present invention.

After the post 101 is formed, the side surface of the AlAs layer 4 is exposed. The substrate (wafer) is exposed to a vapor atmosphere at 350° C. with nitrogen being used as carrier gas (flow rate: 2 liters per minute) for 30 minutes. The AlAs layer 4, which forms a part of the upper multilayer reflection film 5, has an oxidization rate that is very higher than that of the $Al_{0.8}Ga_{0.2}As$ layer or $Al_{0.1}Ga_{0.9}As$ layer which layers form a part of the AlAs layer 4. As shown in FIG. 5D, oxidization starts from the side surface of the AlAs layer 4 just above the active region 3 included in the post 101. This oxidization eventually makes the oxide region 4a that reflects the shape of the post 101. The oxide region 4a has a reduced conductivity and serves as a current confining portion. Further, the oxide region 4a has an optical reflectance (~1.6) that is approximately half the reflectance of the layers, and thus serves as a light confining region. The rest of the AlAs layer 4 that has not been oxidized serves as a conductive region and functions as a current injection part. The aperture of the conductive region has a diameter as large as 10 microns for emission of multimode light.

Figure 5E:
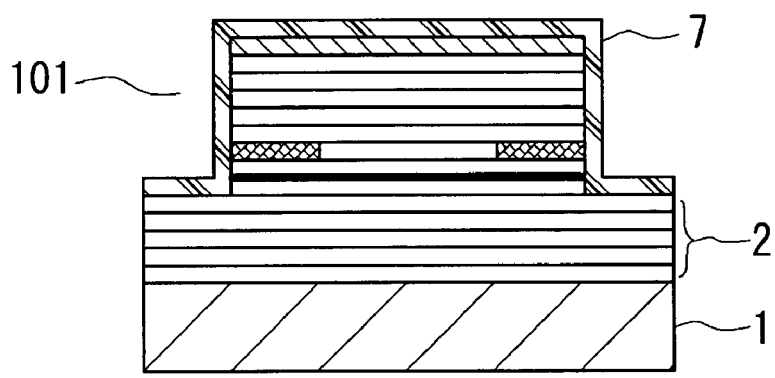
Figure 5F:
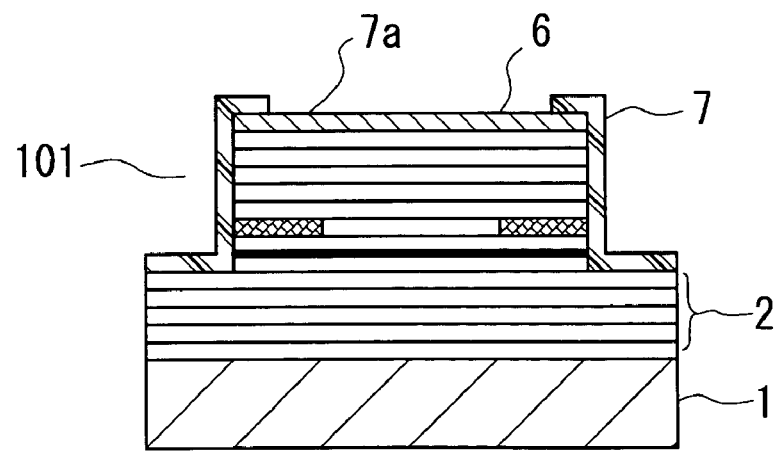

Thereafter, as shown in FIG. 5E, the mask 13 is removed and the exposed side surface of the post 101 is coated with the insulation film 7 that also covers the substrate. Then, as shown in FIG. 5F, a contact hole 7a is formed in the top of the post, so that the interlayer insulation film 7 can be defined.

Figure 6G:
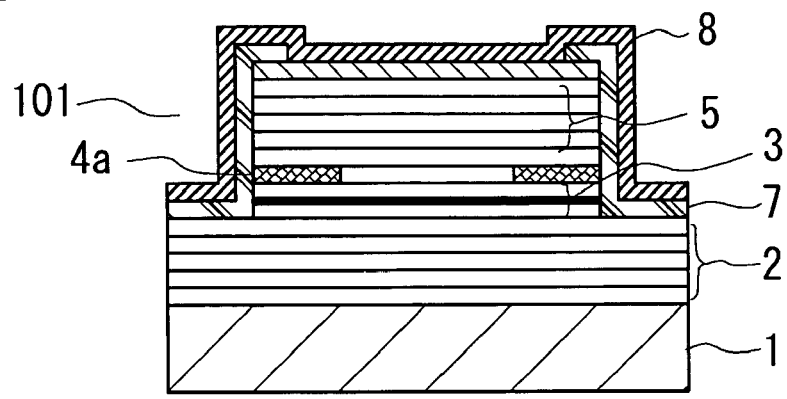
FIGS. 6G, 6H and 6I show yet another part of the method of fabricating the surface emitting semiconductor laser according to the first embodiment of the present invention.
Figure 6H:
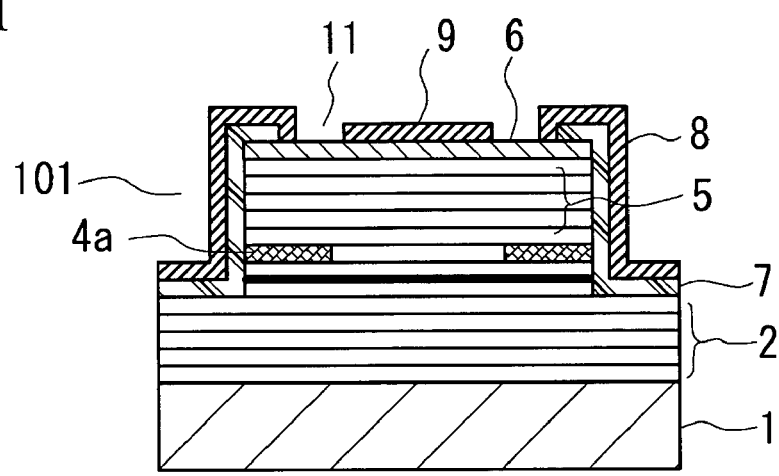
Figure 6I:
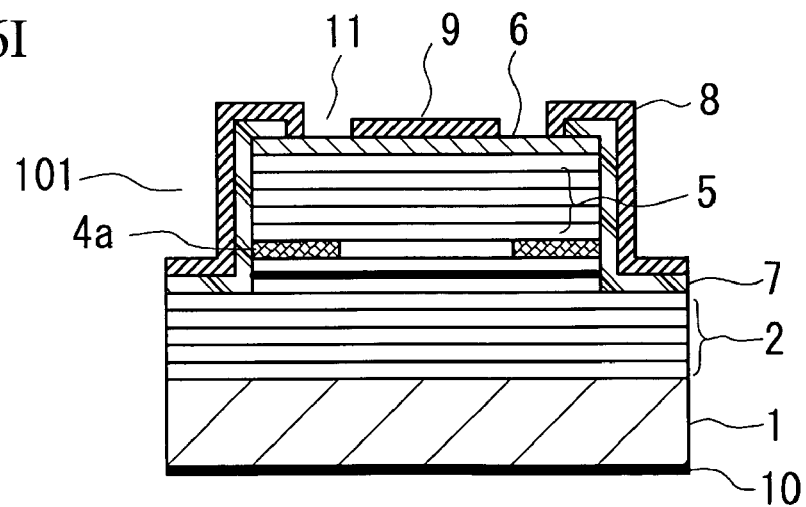

Then, as shown in FIG. 6G, an electrode layer is provided on the entire substrate (wafer) including the post 101, and is then patterned, as shown in FIG. 6H. The p-side electrode 8 defines the emission aperture 11 on the top of the post 101, and simultaneously, the block member 9 is formed. After that, as shown in FIG. 6I, the n-side electrode 10 is formed on the backside of the substrate 1. In the above-mentioned manner, the surface emitting semiconductor laser shown in FIGS. 1A through 1C can be produced. The surface emitting semiconductor laser 110 according to the second embodiment of the present invention, the p-side electrode is patterned so that the block member 9 does not remain.

Figure 9A:
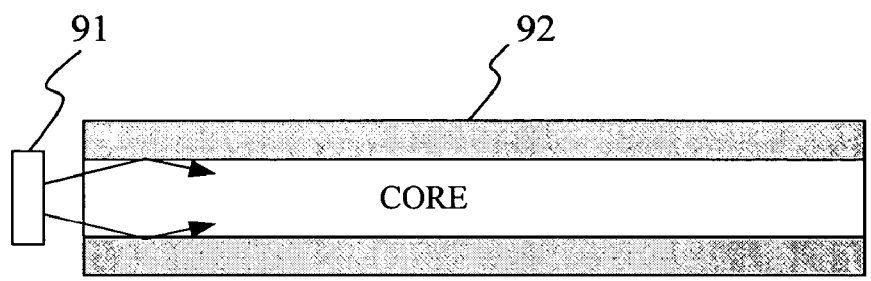
FIGS. 9A and 9B show optical communication systems according to the present invention.
Figure 9B:
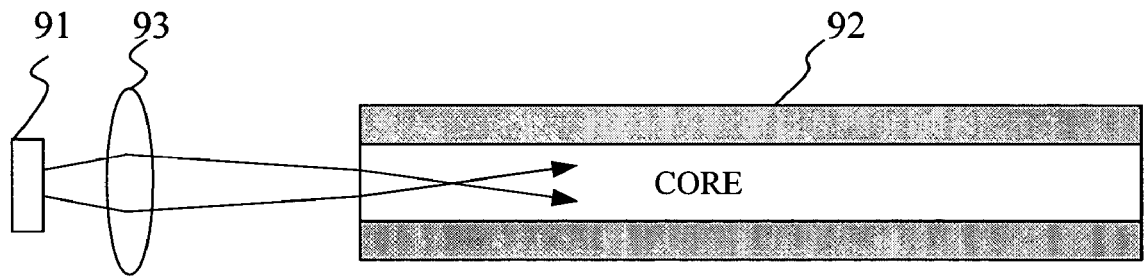

FIGS. 9A and 9B show optical communication systems equipped with the surface emitting semiconductor laser according to the present invention. More particularly, FIG. 9A shows an optical communication system in which a surface emitting semiconductor laser 91 of the invention is directly coupled to an optical fiber 92. FIG. 9B shows another optical communication system in which the surface emitting semiconductor laser 91 is coupled with the optical fiber 92 via a lens.

The present invention is not limited to the specifically disclosed embodiments, and variations and modifications may be made without departing from the scope of the present invention.

In the first and second embodiments of the invention, the light of the fundamental mode is blocked. Alternatively, light of another specific mode may be blocked to reduce the jitter contained in the light signal. Preferably, modes that have a relatively low frequency response are selected. The shape of the block member may be selected in accordance with the mode to be cutoff. The material of the block member may be metal or insulator. It is essential to select a material that can block light of the selected mode. In this regard, the block member may be made of a material that can absorb light of the selected wavelength.

According to the present invention, light of the specific mode is blocked or cutoff by means of a member provided in the emission aperture of the surface emitting semiconductor laser capable of emitting multimode laser light. It is therefore possible to reduce jitter contained in the light signal and improve the frequency response and to transmit data at a higher bit rate.

What is claimed is:

1. A surface emitting semiconductor laser, comprising:
   a laminate of semiconductor layers emitting multimode laser light; and
   a block member blocking light of at least a fundamental mode among the multimode laser light emitted from the laminate,
   the block member being provided separate from an electrode provided on a top of the laminate, wherein:
   the block member is made of a material identical to that of the electrode,
   the laminate includes a current confinement layer having a conductive region, and the block member has a size smaller than a size of the conductive region.

2. The surface emitting semiconductor laser as claimed in claim 1, wherein:
the laminate comprises a substrate, a lower reflection mirror on the substrate, an upper reflection mirror, an active region, and a current confinement layer, the active region and the current confinement layer being interposed between the upper and lower reflection mirrors; and
the block member is provided in an emission aperture provided above the upper reflection mirror.

3. The surface emitting semiconductor laser as claimed in claim 1, wherein:
a top of the laminate is partially covered with the electrode so that an emission aperture can be defined; and
the block member is provided on the top of the laminate and is located in the center of the emission aperture.

4. The surface emitting semiconductor laser as claimed in claim 1, wherein:
the laminate has a mesa;
an emission aperture is formed on the mesa; and
the emission aperture and the block member have shapes related to an outer shape of the mesa.

5. The surface emitting semiconductor laser as claimed in claim 1,
wherein the block member has a diameter D1 defined as follows:

$$D1 = L1 \times 2\tan(\theta n/2)$$

where L1 is a distance from the surface emitting semiconductor laser device to the block member, $\theta n$ is a divergence angle of emitted light of the fundamental mode from an optical source of the surface emitting semiconductor laser device in a far-field image of the multimode laser light.

6. The surface emitting semiconductor laser as claimed in claim 1, wherein the block member is made of metal.

7. An optical communication system, comprising:
a surface emitting semiconductor laser; and
an optical fiber optically connected to the surface emitting semiconductor laser,
the surface emitting semiconductor laser comprising:
a laminate of semiconductor layers emitting multimode laser light; and
a block member blocking light of at least a fundamental mode among the multimode laser light emitted from the laminate,
the block member being provided separate from an electrode provided on a top of the laminate, wherein:
the block member is made of a material identical to that of the electrode,
the laminate comprises a current confinement layer having a conductive region, and
the block member has a size smaller than a size of the conductive region.

* * * * *